United States Patent
Franchini et al.

(10) Patent No.: US 9,673,704 B2
(45) Date of Patent: Jun. 6, 2017

(54) INDUCTIVE LOAD CONTROL CIRCUIT, A BRAKING SYSTEM FOR A VEHICLE AND A METHOD OF MEASURING CURRENT IN AN INDUCTIVE LOAD CONTROL CIRCUIT

(71) Applicants: Christelle Franchini, Fontenilles (FR); Alexis Huot-Marchand, Fonsorbes (FR)

(72) Inventors: Christelle Franchini, Fontenilles (FR); Alexis Huot-Marchand, Fonsorbes (FR)

(73) Assignee: NXP USA, Inc., Austin, TX (US)

( * ) Notice: Subject to any disclaimer, the term of this patent is extended or adjusted under 35 U.S.C. 154(b) by 100 days.

(21) Appl. No.: 14/435,320

(22) PCT Filed: Oct. 15, 2012

(86) PCT No.: PCT/IB2012/002341
§ 371 (c)(1),
(2) Date: Apr. 13, 2015

(87) PCT Pub. No.: WO2014/060787
PCT Pub. Date: Apr. 24, 2014

(65) Prior Publication Data
US 2015/0303805 A1    Oct. 22, 2015

(51) Int. Cl.
*H02M 3/158* (2006.01)
*B60T 8/17* (2006.01)
(Continued)

(52) U.S. Cl.
CPC ............ *H02M 3/158* (2013.01); *B60T 8/17* (2013.01); *B60T 8/885* (2013.01); *G01R 17/00* (2013.01);
(Continued)

(58) Field of Classification Search
CPC ......... H02M 3/158; H02M 2001/0009; H02M 2003/1555; G01R 17/00; G01R 31/006;
(Continued)

(56) References Cited

U.S. PATENT DOCUMENTS 5,541,806 A * 7/1996 Hoffman ............ H01H 47/325
361/154
5,763,963 A    6/1998 Zydek et al.
(Continued)

OTHER PUBLICATIONS

International Search Report and Written Opinion correlating to PCT/IB2012/002341 dated Jun. 27, 2013.

*Primary Examiner* — Gustavo Rosario Benitez
(74) *Attorney, Agent, or Firm* — Charlene R. Jacobsen

(57) ABSTRACT

A method and circuit for controlling current through an inductive load such as an electromagnetic valve of a vehicle anti-lock braking system includes first and second driver stages, controlled by PWM (pulse width modulation) signals, for providing, respectively, an actuation path for valve current in an "on" phase and a recirculation path for valve current in an "off" phase. A peak value of current flowing in the actuation path at the end of an "on" phase is compared with a peak value of current flowing in the recirculation path at the start of the "off" phase in order to detect any malfunction of the circuit. An embodiment of the invention has the advantage of being able to detect any malfunction at very low and very high PWM duty cycles.

13 Claims, 5 Drawing Sheets

(51) Int. Cl.
*G01R 31/327* (2006.01)
*G01R 17/00* (2006.01)
*G01R 31/00* (2006.01)
*B60T 8/88* (2006.01)
*H03K 17/082* (2006.01)
*H03K 17/18* (2006.01)
*H02M 3/155* (2006.01)

(52) U.S. Cl.
CPC ......... *G01R 31/006* (2013.01); *G01R 31/327* (2013.01); *H03K 17/0822* (2013.01); *H03K 17/18* (2013.01); *B60T 2270/402* (2013.01); *H02M 2003/1555* (2013.01)

(58) Field of Classification Search
CPC .. G01R 31/327; H03K 17/0822; H03K 17/18; B60T 8/17; B60T 8/885; B60T 2270/402; B60T 13/68
See application file for complete search history.

(56) References Cited

U.S. PATENT DOCUMENTS

| | | | |
|---|---|---|---|
| 5,892,650 A | 4/1999 | Kinoshita et al. | |
| 6,275,016 B1* | 8/2001 | Ivanov | H02M 3/158 323/224 |
| 7,047,119 B2 | 5/2006 | Fey et al. | |
| 2003/0006749 A1* | 1/2003 | Rollman | G01R 19/25 324/76.11 |
| 2004/0078132 A1 | 4/2004 | Fey et al. | |
| 2004/0260501 A1* | 12/2004 | Fey | B60T 8/885 702/117 |
| 2009/0072809 A1* | 3/2009 | Kaltenegger | G01R 31/024 324/76.11 |
| 2009/0299592 A1 | 12/2009 | Oehler et al. | |
| 2010/0315091 A1* | 12/2010 | Hartlieb | H02M 1/32 324/509 |
| 2011/0057644 A1 | 3/2011 | Oehler et al. | |
| 2011/0057645 A1 | 3/2011 | Jager et al. | |
| 2011/0169468 A1* | 7/2011 | Wu | H02M 3/157 323/282 |

* cited by examiner

INDUCTIVE LOAD CONTROL CIRCUIT, A BRAKING SYSTEM FOR A VEHICLE AND A METHOD OF MEASURING CURRENT IN AN INDUCTIVE LOAD CONTROL CIRCUIT

FIELD OF THE INVENTION

This invention relates to an inductive load control circuit, a braking system for a vehicle and a method for measuring current in such a circuit.

BACKGROUND OF THE INVENTION

In an automotive vehicle, electromechanical hydraulic valves (incorporating a solenoid coil) are typically employed in an anti-lock braking system of the vehicle. Such valves may be actuated by electrical control circuits comprising semiconductor components such as power MOSFETs (metal oxide silicon field effect transistor). The valves, and consequently the hydraulic pressure in a braking system, can be controlled using a pulse width modulated driver stage incorporating at least one power MOSFET.

One known valve control circuit is shown in FIG. 1 and indicated generally at 100. A similar arrangement is described in US-A1-20090299592. In FIG. 1 an inductive load 101 (for example the coil of an electromechanical hydraulic valve) is controlled by a high side driver circuit 102 and a low side driver circuit 103. The high side driver circuit 102 comprises a high side driver 104 and a high side transistor 105. An output of the high side driver 104 is connected to the gate of the high side transistor 105. The low side driver circuit 103 comprises a low side driver 106 and a low side transistor 107. An output of the low side driver 106 is connected to the gate of the second transistor 107. The high side and low side transistors 105, 107 act as switches and may comprise MOSFET devices. The coil 101 is connected across the high side transistor 105 and between a voltage source V and the low side transistor 107. In the example of FIG. 1, the high side driver 104 controls the gate of the high side transistor 106 in a PWM (pulse width modulated) mode according to a PWM control signal which is applied to an input of the high side driver 104. An additional low side driver PWM control signal applied to the input of the low side driver 106 controls the gate of the second low side transistor 107. The high side and low side transistors 105. 107 are driven in opposite phase. When the low side transistor 107 is on, current flows through the coil 101 via an actuation path 108 and the current in the coil rises exponentially. When the low side transistor 107 is turned off, the high side transistor is switched on so that a continuous flow of the coil current is possible via a recirculation path 109.

FIGS. 2A, 2B, 2C illustrate the current variation through the coil 101 (FIG. 2A) and the PWM control signals applied to the low side transistor 107 and high side transistor 105 (FIG. 2B, FIG. 2C respectively). During the time period ton during which low side transistor 107 is on (and transistor 105 is off) the coil current rises towards a maximum value. During the subsequent time period toff during which the low side transistor 107 is off (and transistor 105 is on), the coil current decreases. The process then repeats under the control of the PWM signals generated by each driver 104, 106. Thus an average current value in the coil 101 may be set by adjusting the duty cycle of the PWM signals. A current value may be regulated by comparison with a defined target current. Certain automotive systems such as adaptive cruise control, for example, require very precise valve current control even in very small current ranges (of around 100 mA typically). Such currents correspond to very low PWM duty cycles.

As an automotive braking system is a safety-critical system, a failsafe operation of the valve control circuit is desirable. Therefore, not only is it necessary that the valve current be precisely regulated but that any defect in the valve control circuit should be detectable so that appropriate action may be taken. Detection of a defect in the control circuit may result in disconnection of the associated control unit or switching over to an auxiliary/emergency system. It is usual practice to incorporate some redundancy in safety critical functions. In the particular case of electromagnetic valve actuation for automotive braking system control, the valve coil current may be measured both in the actuation path (i.e. low side current) and the recirculation path (i.e. high side current). A comparison may be made between the two measurements whereby detection of any discrepancy indicates a failure somewhere in the control circuit U.S. Pat. No. 5,763,963 describes a circuit arrangement for controlling the current in inductive loads by pulse width modulation. For safety purposes, a second redundant current measuring is performed by way of an additional switching transistor in parallel with the low side driver switch. This additional transistor is actuated at preset time intervals. However, this arrangement does not guarantee redundancy during each PWM period. Furthermore the diagnostic current measurement is performed by the additional parallel circuit branch rather than by the existing current regulation loop and the additional circuitry is area-consuming as the additional low side transistor size may be the same as the low side power transistor.

U.S. Pat. No. 7,047,119 discloses a circuit arrangement for controlling current through an inductive load by pulse width modulation wherein the current measurement takes place as close as possible to ton/2 in the actuation path or toff/2 in the recirculation path (see FIGS. 2B and 2C). Such measurements may give a reasonable estimate of the mean value of the coil current. An analogue-to-digital converter (ADC) is employed in circuitry for measuring the current. However, this arrangement has a lower limit (ton_min) with respect to its shorter adjustable duty cycle of ton_min=2Tconv, where Tconv is the conversion time of the ADC. So below this lower limit (that is; for very low duty cycles), there is not enough time to measure current in the actuation path so only the current in the recirculation path can be used for valve current regulation. Therefore current measurement redundancy is lost. The same analysis applies for a lower limit for toff at high duty cycles.

US 20090299592 A1 discloses an electronic controller that uses pulse width modulation to control inductive load currents and incorporates an ADC which is a sigma-delta modulator. For very small duty cycles the power device in the actuation path is switched on at defined times for a short time to allow current measurement in the actuation path. Similarly, for very high duty cycles the power device in the actuation path is switched off for a short time to allow current measurement in the recirculation path. This arrangement has the disadvantage of causing some noise in the current regulation system.

SUMMARY OF THE INVENTION

The present invention provides an inductive load control circuit, a braking system for a vehicle and method of measuring current in an inductive load control circuit as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION

The present invention will now be described with reference to a load current control circuit 300 illustrated in FIG. 3. Such a circuit may find application in the automotive field for controlling the actuation of an electromechanical valve such as can be found in an anti-lock braking system. A load of this type is an inductive load and represented as a coil 301 in FIG. 3

Because the illustrated embodiments of the present invention may for the most part, be implemented using electronic components and circuits known to those skilled in the art, details will not be explained in any greater extent than that considered necessary as illustrated, for the understanding and appreciation of the underlying concepts of the present invention and in order not to obfuscate or distract from the teachings of the present invention. Furthermore, it will be appreciated that the present invention is not limited to the specific embodiments illustrated and described herein and in particular, is not limited to a control circuit and method for measuring current in a control circuit in an automotive braking system.

Figure 3:
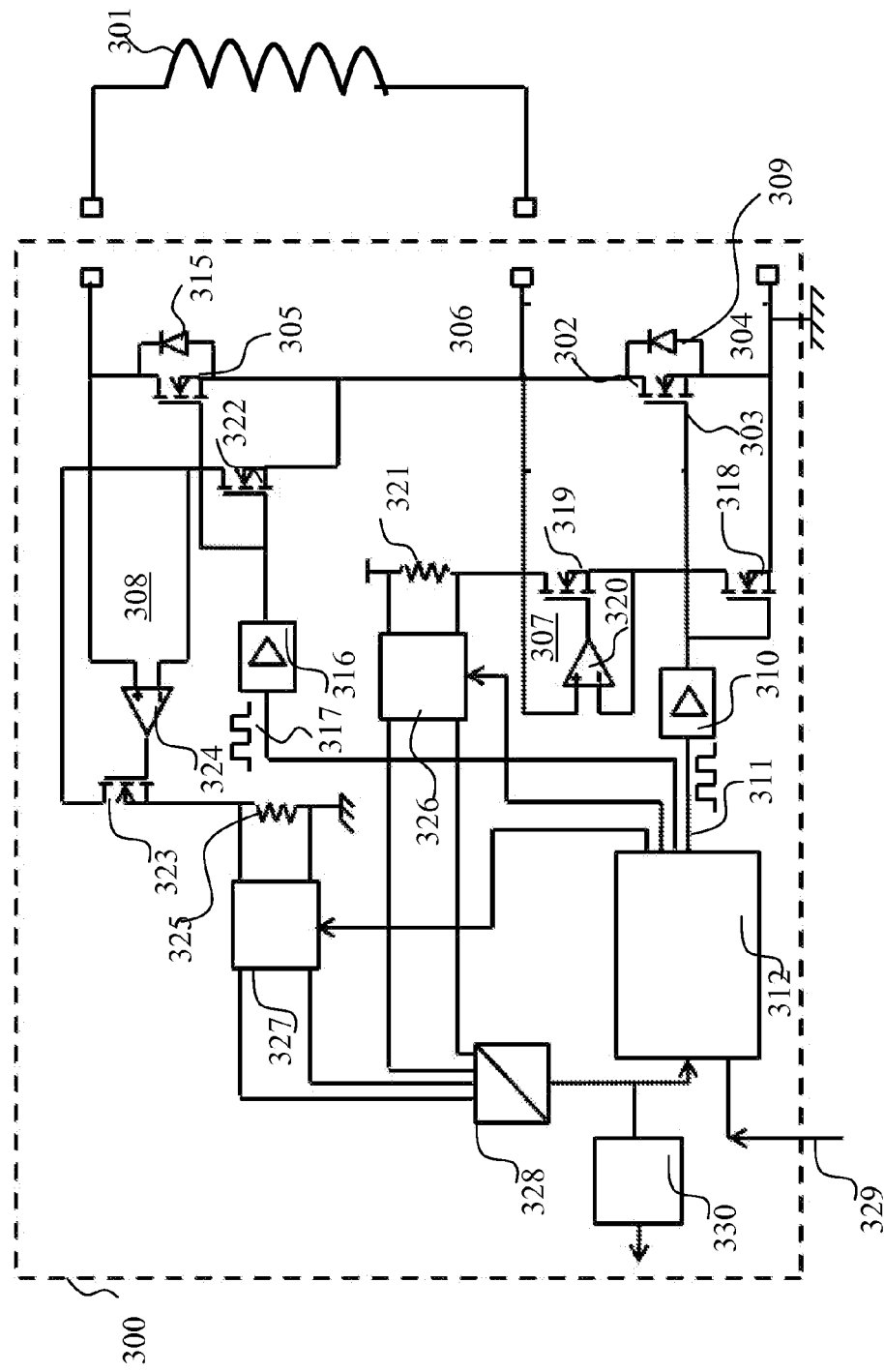
FIG. 3 illustrates a simplified circuit diagram of a first example of an inductive load control circuit.

Referring now to FIG. 3, there is illustrated a simplified circuit diagram of an example of a load current control circuit 300 for an inductive load which in the illustrated example comprises a coil 301 of an electromechanical valve of a motor vehicle braking system. The circuit 300 may be implemented within an integrated circuit device 300. The integrated circuit device may comprise one or more dies provided in a single package with electronic components provided on the dies that form the circuits and which are connectable to other components outside the package through suitable connections, such as pins of the package and bondwires between the pins and the dies. The circuit may form a part of a braking system 300, 301 for a vehicle The load current control circuit 300 comprises a first driver stage which may comprise a first switch 302. The first driver stage will be referred to hereafter as a low side driver stage. The first switch 302 may be a transistor, controlled by a PWM signal applied to its gate 303. On closing the first switch 302, current may flow through the coil 301 and the low side driver stage serves as an "actuation" path 304 for the inductive load current. The load current control circuit may also comprise a second driver stage referred to hereafter as a high side driver stage and may comprise a second switch 305. When the first switch 302 is opened and the second switch 305 is closed, the coil current is allowed to decay through the second switch 305. Hence, the high side driver stage serves as a recirculation path 306 for the inductive load current.

A first current measuring stage 307, referred to hereafter as a low side current measuring stage 307, comprising elements to be described in greater detail below, may be operably coupled to the low side driver stage 302 so that current flowing in the actuation path 304 may be sampled at predetermined times with respect to the switching of the switch 302. A second current measuring stage 308, referred to hereafter as a high side current measuring stage 308, comprising elements to be described in greater detail below, may be operably coupled to the high side driver stage 305 so that the current flowing in the recirculation path 306 may similarly be sampled at predetermined times.

The first switch 302 comprising the low side driver stage may comprise a transistor operated as a switch which, in the illustrated example, comprises a low side N-channel power MOSFET 302 (metal oxide semiconductor field effect transistor). This low side power MOSFET 302 incorporates a body-drain diode 309. A source node of the low side power MOSFET 302 is operably coupled to ground. A drain node of the low side power MOSFET 302 is operably coupled to a first end of the coil 301. The other end of the coil is operably coupled to a power supply (not shown) which in this example may be the battery of a motor vehicle. In this manner, the low side power MOSFET 302 is operably coupled between the coil 301 and ground and as such, comprises a low side switch which is arranged to selectively couple the coil 301 to ground in accordance with a bias voltage received at its gate node 303, the gate node 303 forming a control terminal of the low side MOSFET 302. In the illustrated example, the bias voltage applied to the gate node 303 of the low side MOSFET 302 is supplied by a low side gate driver in the form of a low side buffer logic gate 310. This low side buffer logic gate 310 is arranged to receive a low side control signal 311 and to output a corresponding control signal in the form of a bias voltage to the gate node 303 of the low side power MOSFET 302. The received low side control signal 311 may be a PWM (pulse width modulation) signal, supplied by an output from a control module 312. Hence the low side power MOSFET 302 is turned on in order to actuate the valve comprising the coil 301 in an "ON" phase.

The second switch 305 comprising the high side driver stage may comprise a transistor operated as a switch which in the illustrated example comprises a high side N-channel power MOSFET 305. This high side power MOSFET 305 incorporates a body-drain diode 315. A drain node of the high side MOSFET 305 is operably coupled to the power supply. A source node of the high side power MOSFET 305 is operably coupled to the drain node of the low side power MOSFET 302. Hence the coil 301 is operably coupled across the high side power MOSFET 305. In this manner, the high side power MOSFET 305 comprises a high side switch which is arranged to selectively allow coil current to recirculate in accordance with a bias voltage received at its gate. In the illustrated example, the bias voltage applied to the gate of the high side MOSFET 305 is supplied by a high side gate driver in the form of a high side buffer logic gate 316. This high side buffer logic gate 316 is arranged to receive a high side control signal 317 and to output a corresponding control signal in the form of a bias voltage to the gate of the high side power MOSFET 305. The received high side control signal 317 may be a PWM (pulse width modulation) signal, supplied by an output from the control module 312. Hence the high side power MOSFET is turned on during an "OFF" phase thereby providing a recirculation path for coil current.

An example of a low side current measuring stage 307 will now be described in greater detail. A low side current sensing device which in the illustrated example is a N-channel sense MOSFET 318, is connected in parallel with the low side power MOSFET 302 and is used to measure the current in the power MOSFET 302. The current in the low side sense MOSFET 318 is proportional to the current in the low side power MOSFET 302 as the ratio of the areas of the two MOSFETs. This type of current measuring arrangement is known and described in U.S. Pat. No. 5,079,456. The low side current measuring stage 307 may also comprise a low side follower transistor 319 which in the illustrated example is a N-channel MOSFET whose source node is operably coupled with a drain node of the low side sense MOSFET 318. The low side current measuring stage 307 may also comprise a low side operational amplifier 320 having a first input operably coupled to the source node of the low side follower transistor 319 and a second input operably coupled to the drain node of the low side power MOSFET 302. An output of the operational amplifier 320 is operably coupled to the gate of the low side follower MOSFET 319. The low side operational amplifier 320 may be used to equalise the drain voltages of the low side power MOSFET 302 and the low side sense MOSFET 318. This functionality is advisable if the proportionality of the currents in the low side power MOSFET 302 and the low side sense MOSFET 318 is to be maintained. The low side follower MOSFET 319 and the operational amplifier 320 operate together in order to recopy the drain voltage of the low side power MOSFET 302 to the drain of the low side sense MOSFET 318. A low side resistor 321 may be connected between the drain of the low side follower MOSFET 319 and a voltage source (not shown). The low side resistor 321 may be used to convert the current in the low side sense MOSFET 318 into a voltage.

An example of a high side current measuring stage 308 may comprise similar components to those of the low side current measuring stage 307. In the illustrated example, a high side current sensing device comprises a N-channel MOSFET 322 which is connected in parallel with the high side power MOSFET 305 and is used to measure the current in the power MOSFET 305. The current in the high side sense MOSFET 322 is proportional to the current in the high side power MOSFET 305 in the ratio of the areas of the two MOSFETs. The high side current measuring stage 308 may also comprise a high side follower transistor 323 which in the illustrated example is a N-channel MOSFET whose drain node is operably coupled to the drain node of the high side sense MOSFET 322. The high side current measuring stage 308 may also comprise a high side operational amplifier 323 having a first input operably coupled to the drain node of the high side follower transistor 322 and a second input operably coupled to the drain node of the high side power MOSFET 305. An output of the operational amplifier 324 is operably coupled to the gate of the high side follower MOSFET 323. The high side operational amplifier 324 may be used to equalise the drain voltages of the high side power MOSFET 305 and the high side sense MOSFET 322. This functionality is advisable if the proportionality of the currents in the high side power MOSFET 305 and the high side sense MOSFET 322 is to be maintained. The high side follower MOSFET 322 and the high side operational amplifier 324 operate together in order to recopy the drain voltage of the high side power MOSFET 305 to the drain of the high side sense MOSFET 322. A high side resistor 325 may be connected between the source of the low side follower MOSFET 323 and ground. The high side resistor 325 may be used to convert the current in the high side sense MOSFET 322 into a voltage.

The low side current measuring stage 307 and the high side current measuring stage 308 may each comprise a sample and hold module 326 and 327 respectively. A low side sample and hold module 326 may be connected across the low side resistor 321. A high side sample and hold module 327 may be connected across the high side resistor 325. Each sample and hold module 326, 327 may comprise one or more memory elements arranged to enable current measurements at defined moments (that is; a particular sampling time) by storing an analogue measured value (in a holding phase). Each memory element may be realised by a simple capacitor that maintains the voltage across the low side resistor 321 when the low side power MOSFET 302 is disabled or across the high side resistor 325 when the high side power MOSFET 305 is disabled.

The load current control circuit 300 may also comprise an analog to digital converter (ADC) 328 having inputs connected to each sample and hold module 326, 327. The ADC 328 may be used to convert the sampled and held analog values into the digital domain, thereby providing a digital representation of current through the actuation path 304 and the recirculation path 306. In the example of an automotive braking system, several valve currents require measurement during a PWM period. By virtue of the sample and hold principle, a single ADC can be used for all the measurements. An output of the ADC 328 may be operably coupled to the control module 312.

The control module 312 may include a digital current regulator functionality whereby the control module 312 is arranged to adjust a PWM duty cycle to regulate the measured current to a target current. A value of target current may be fed into an input 329 of the control module 312 from an external source (not shown). The control module may also be operably coupled to each of the sample and hold modules 326, 327.

The load current control circuit 300 may comprise a comparator 330, operably coupled to an output of the ADC 328. The comparator may be arranged to compare sampled values, for example, mean values or peak values (high or low), of the currents flowing in the actuation path 304 and the recirculation path 306 and to generate an error signal if the difference between the two values exceeds a predetermined threshold.

The circuit 300 of FIG. 3 may be used to regulate current in a load 301, for example, a valve in a vehicle braking system, in a failsafe manner even for very low and very high PWM duty cycles.

Figure 1:
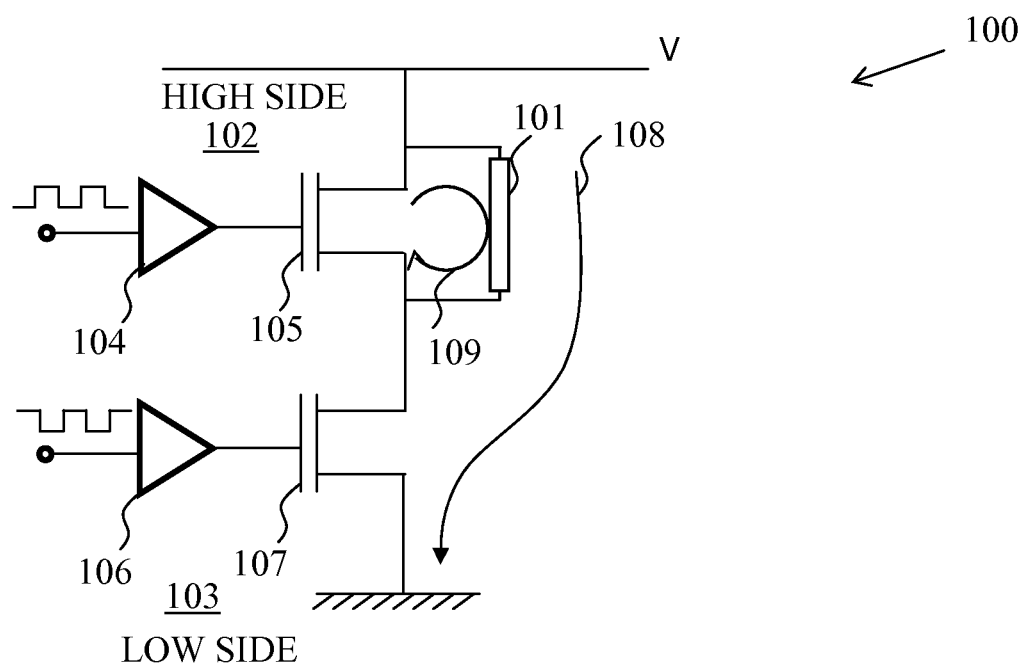
FIG. 1 illustrates a simplified circuit diagram of a known current measuring circuit.
Figure 2:
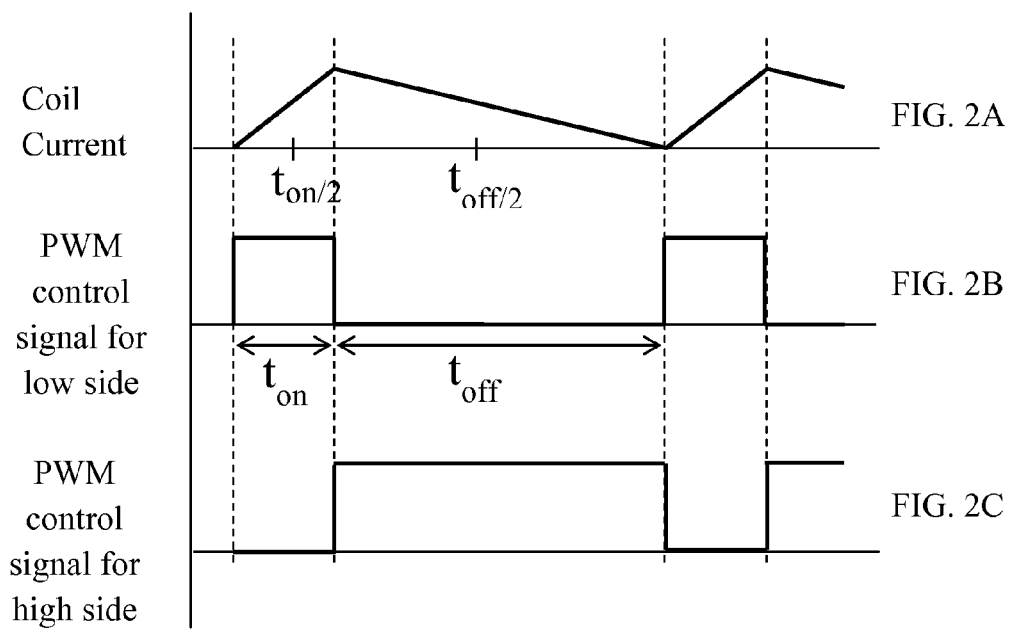
FIGS. 2A, 2B and 2C illustrate control signals and current flow in the circuit of FIG. 1.

In one mode of operation, the current measuring stages 307 and 308 may be operated (under the control of the control module 312) to measure (mean) current values at mid-Ton in the low side driver stage (actuation path 304) and at mid-Toff in the high side driver stage (recirculation path 306). That is, with reference to FIG. 2, at points t on/2 and t off/2. Both measured current values may be compared in the comparator 330 in order to ensure correct function of the circuit. Either one of the measured mean values (in the actuation path 304 and in the recirculation path 306) may be used by the current regulator functionality of the control module 312 to adjust the PWM signals fed to each buffer logic gate 310, 316 so that the valve current may be kept at the target value. This target value may be programmed via a serial peripheral interface (SPI) communication protocol.

For example, during a valve actuation phase (T on) the low side power MOSFET 302 is turned on. The resulting current flowing in the actuation path 304 is measured using the low side sense MOSFET 318 and converted to a voltage across the low side resistor 321. A voltage measurement is performed at the middle of the "on" phase. This measurement is facilitated in the low side sample and hold module 326 where a capacitor (not shown) may store the voltage value until a timeslot is allocated (by the control module 312) during which, the ADC 328 performs a conversion to a digital value. This digital value is then compared with the target current value received by the control module at its input 329. In response to the comparison, the current regulator functionality in the control module 312 serves to adjust the PWM duty cycle to minimise any differences between the two values.

During the recirculation phase (T off), the high side power MOSFET 305 is turned on (the low side and a high side power MOSFET's 302, 305 are driven in opposite phase). In a similar fashion, the current in the recirculation path 306 is measured using the high side sense MOSFET 322 and converted to a voltage across the high side resistor 325. This voltage is sampled by the high side sample and hold module 327 at mid-T off for subsequent conversion to a digital value by the ADC 328. Both low side and high side current values may be used in the regulation process but for very low duty cycles of typically less than 20% (very small currents) and very high duty cycles of typically more than 80% (very high currents) only one of these two (mean current measurements as possible.

A failsafe operation may be guaranteed at intermediate PWM duty cycles by comparison of low side and high side (mean) currents measured at mid-T on an mid-T off. However, for very low duty cycles current sampling at mid-T on is not possible because there is not sufficient time to complete the measurement process. While the sampling time is fast, as it merely comprises connecting a capacitor to a resistor, the time taken to gain an accurate measurement of the sensed current is comparatively long. The sensing time is related to the switching time of the power devices in the circuit and to the settling time of the operational amplifiers 320, 324. Also, the switching the times of the power devices has an upper limit set by electromagnetic interference considerations. The present invention overcomes this problem by measuring the high peak values of current in both the actuation path 304 and the recirculation path 306. This may be done by sampling low side current at the end of the "on" phase followed by sampling high side current at the beginning of the "off" phase. The two (high) peak current measurements may then be used for current comparison to ensure failsafe operation. A difference in the two values which exceeds a predetermined threshold indicates a fault somewhere in the control circuit. In response to such an indication an error signal may be generated by the comparator 330. In addition, a mid-T off current measurement may be made (by an additional capacitor in the high side sample and hold module 327) for current regulation purposes.

For very high duty cycles, current sampling at mid T-off is not possible, again, because of there being insufficient time to complete the measurement process. The present invention overcomes this problem by measuring. low peak values of current in both recirculation and actuation paths. This may be done by sampling high side current at the end of the "off" phase followed by sampling low side current at the beginning of the "on" phase. The two low peak current measurements may be used for current comparison to ensure failsafe operation. A difference in the two values which exceeds a predetermined threshold indicates a fault somewhere in the control circuit. In response to such an indication an error signal may be generated by the comparator 330. In addition, a mid-Ton current measurement may be made by an additional capacitor in the low side sample and hold module 326 for current regulation purposes.

By virtue of the invention, by comparing low side and high side peak currents (rather than mean currents), the sampling time is delayed to just before the end of "on" time (or "off" time) instead of the middle of these two periods. This lowers the limit when the "on" time (or "off" time) is no longer sufficient for current measurement. In this way it is still possible to compare low side and high side currents at very low or very high duty cycles.

Figure 4:
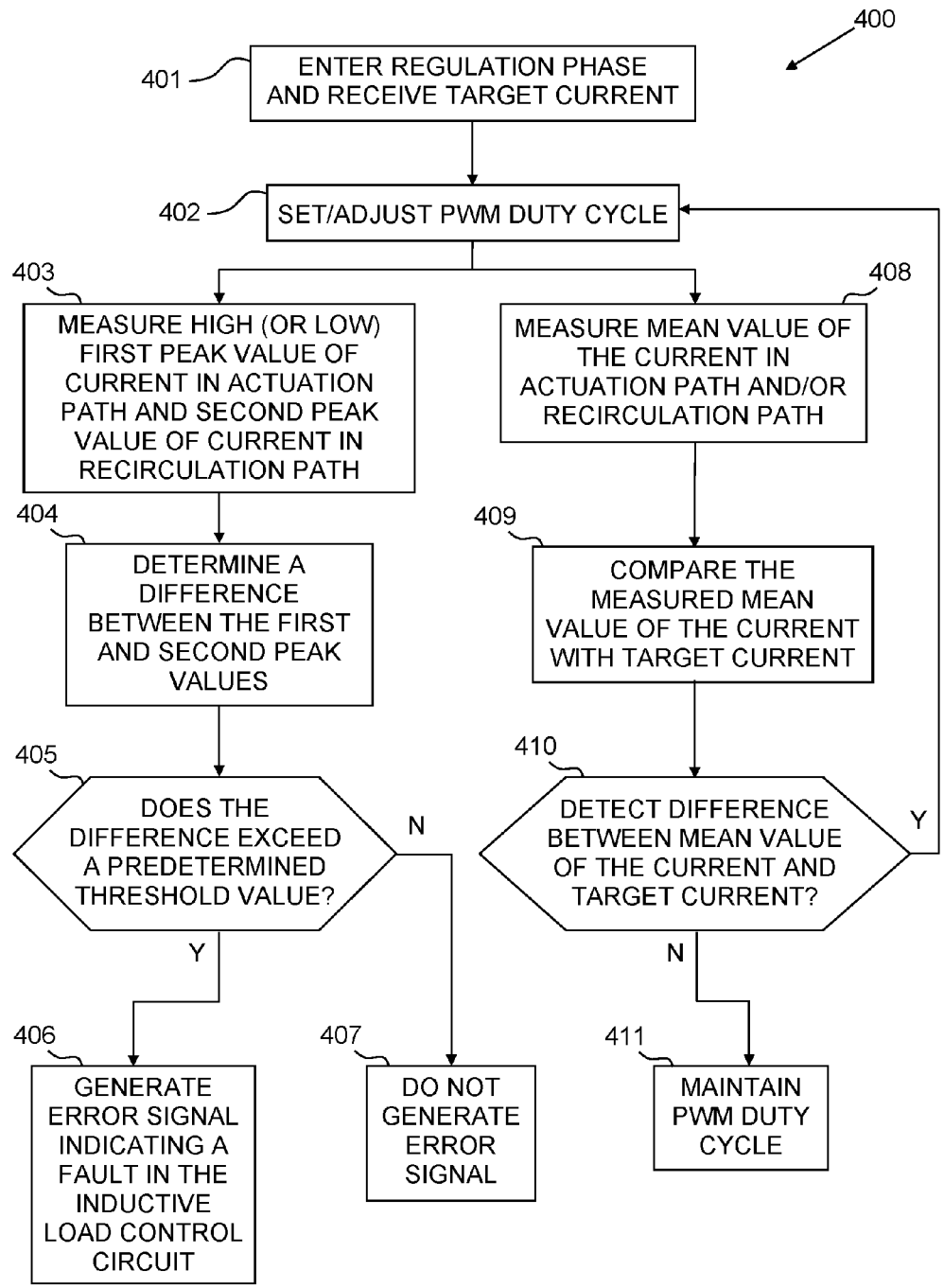
FIG. 4 illustrates a simplified flowchart of an example of a method of measuring current through an inductive load.

On receipt of a target current value at the input 329, the control module 312 may determine whether the duty cycle of the PWM signals will be need to be set very low, very high or at some intermediate level. Therefore, the control module 312 can decide when the current values in each of the actuation and recirculation paths are to be sampled. For example, if the target current is very small, then the control module 312 controls the sample and hold modules 326, 327 and the ADC 328 so that high peak current values are sampled at the end of the "on" phase and at the start of the "off" phase. These high peak values may be compared in order to perform a safety check of the circuit. Additionally, the control module 312 may control the sample and hold modules 326, 327 and the ADC 328 so that a mean value of the valve current may be sampled in the recirculation path at mid-Toff for regulation purposes Conversely, if the target current is very large, then the control module 312 controls the sample and hold modules 326, 327 and the ADC 328 so that low peak current values are sampled at the end of the "off" phase and the start of the "on" phase. These low peak values may be compared in order to perform a safety check of the circuit. Additionally, the control module 312 may control the sample and hold modules 326, 327 and the ADC 328 so that a mean value of the valve current may be sampled in the actuation path at mid-Ton for regulation purposes Referring now to FIG. 4 there is illustrated a simplified flowchart 400 of an example of a method of measuring the current in an inductive load control circuit. The method starts at 401 where the circuit enters a current regulation phase and receives, at the control module 312 a target current value. Next at 402, the control module 312 sets the duty cycle of the PWM signals. In a safety check branch comprising 403-407, at 403 a measurement of high (or low) first peak value of current in the actuation path and second peak value of current in the recirculation path are made. At 404 the difference between the first and second peak values is determined. At 405 a determination is made as to whether the difference between the first and second peak values exceeds a predetermined threshold value. If the compared difference is greater than the predetermined threshold value, then at 406 an error signal is generated. However, if the compared difference is not greater than the predetermined threshold value, then at 407 an error signal is not generated. The error signal may be used by a vehicle subsystem (not shown) in order to put the braking system into a safety mode. In a regulation branch comprising 408-411, at 408 a measurement of mean value of the current in the actuation path and/or the recirculation path is made. At 409 a comparison is made between measured mean value of the current and the target current. At 410 a determination is made as to whether there is a detected difference between the mean value of the current and the target value. If there is a detected difference between the mean value of the current and the target current then the method may revert to 402. However, if there is not a detected difference between the mean value of the current and the target current then at 411 the PWM duty cycle is maintain, i.e., not changed from that set at 402.

Automotive safety requirements may specify a capability to detect a failure or malfunction of the valve control circuit in a braking system outside the current regulation mode; that is, when the valves are not required to be actuated. One way of operating the circuit of FIG. 3 in such circumstances is to operate the circuit in an open loop mode using low duty cycle PWM signals so that the current is limited to less than around 100 mA, which typically ensures that the valve will not be actuated even though this small current will be flowing through the coil 301. A high peak current value in the actuation path 304 may be sampled at the end of an "on" phase. Subsequently a high peak current value in the recirculation path 306 may be sampled at the start of an "off" phase. The peak current values will be set by the T-on time. A difference in the two peak values which exceeds a predetermined threshold as determined by the comparator 330 may indicate a failure or malfunction somewhere in the circuit. This process may be influenced by external conditions such as temperature, vehicle battery voltage and the resistance of the valve coil 301.

Figure 5:
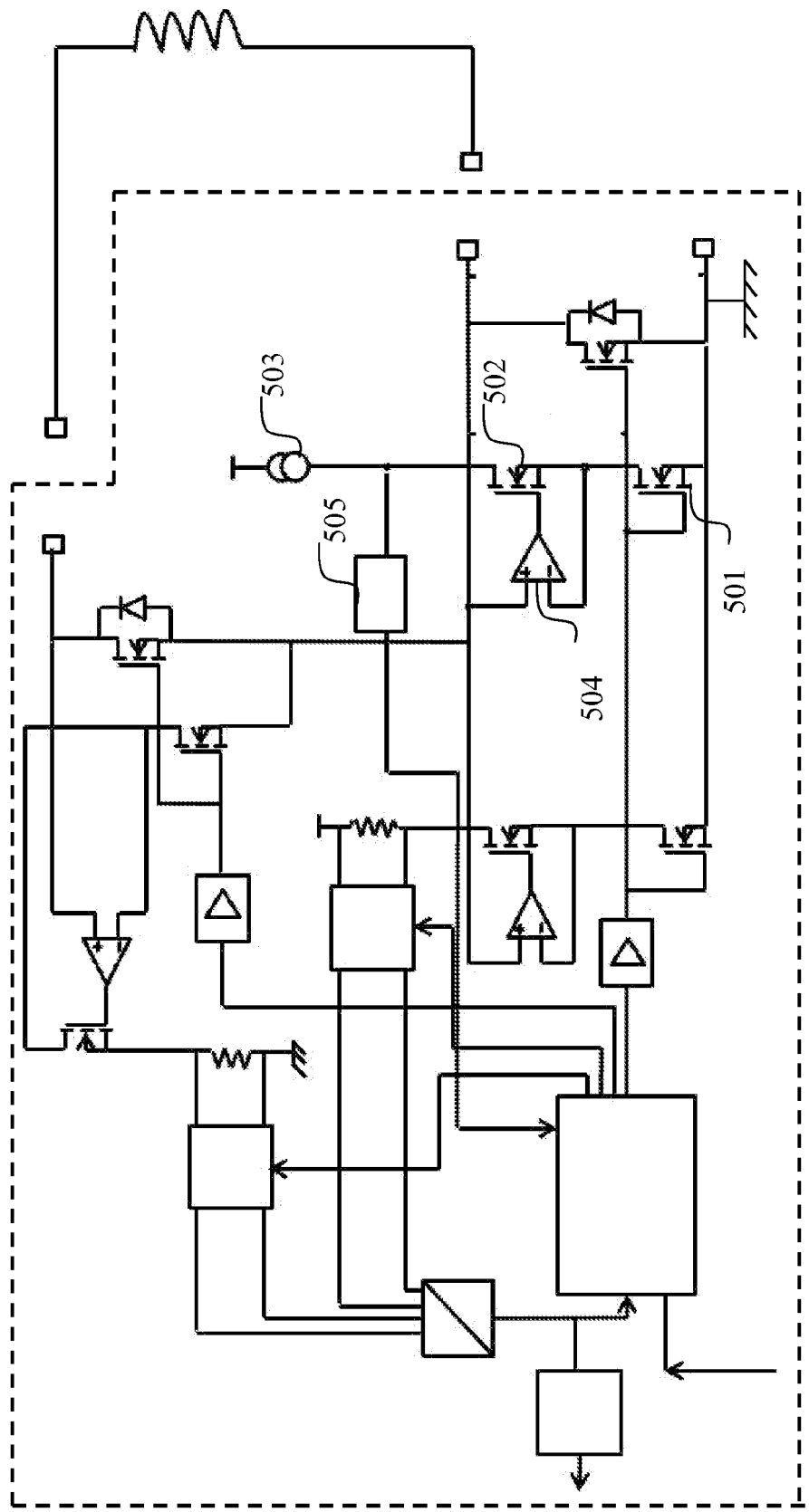
FIG. 5 illustrates a simplified circuit diagram of a second example of an inductive load control circuit.

An alternative circuit arrangement which may be operated in a diagnostic mode and which is not influenced by temperature, vehicle battery voltage or valve coil resistance is illustrated in FIG. 5. The circuit of FIG. 5 comprises the load control circuit of FIG. 3 plus some additional circuitry included in the low side driver stage. The additional components comprise an additional low side current measuring stage. A sense transistor 501 which in the illustrated example comprises an N-channel MOSFET has a source node operably coupled to ground and a gate node operably coupled to the gate of the low side power MOSFET 302. A follower transistor 502 which in this example comprises an N-channel MOSFET as a source node operably coupled to a drain node of the sense transistor 501. A drain node of the follower transistor 502 is operably coupled to a test current source 503. An operational amplifier 504 has a first input operably coupled to the drain node of the sense transistor 501 and a second input operably coupled to the drain node of the low side power MOSFET 302. An output of the operational amplifier 504 is operably coupled to the gate of the follower transistor 502. A peak detector module 505 is operably coupled between the test current source 503 and the control module 312. In the example of FIG. 5 switching of the low side power MOSFET 302 and the high side power MOSFET 305 is driven by a comparison between the sensed current in the actuation path 304 and a current supplied by the test current source 503.

In operation of the circuit of FIG. 5 in diagnostic mode, the low side power MOSFET 302 is switched on. The current through this MOSFET 302 is measured using the sense transistor 501. The resulting sensed current is compared with a test current supplied by the test current source 503. The crossing of these two currents is detected by the peak detector module 505 which sets an output flag which is received by the control module 312. On receipt of the flag, the control module 312 initiates the sampling of current in the actuation path 304 immediately before the low side power MOSFET 302 is switched off. The high side power MOSFET 305 is then switched on and current through the recirculation path is sampled immediately afterwards. The sampled peak currents in the actuation path and recirculation paths are compared in the comparator module 330. If they are not equal, a failure is detected and a vehicle subsystem (not shown) may put the braking system into a safety mode.

In the foregoing specification, the invention has been described with reference to specific examples of embodiments of the invention. It will, however, be evident that various modifications and changes may be made therein without departing from the broader spirit and scope of the invention as set forth in the appended claims. Although specific conductivity types or polarity of potentials have been described in the examples, it will appreciated that conductivity types and polarities of potentials may be reversed For example, it will be appreciated by those skilled in the art that the N-channel MOS devices of the current measuring circuits of FIGS. 3 and 5 may be replaced with P-channel MOS devices provided that the appropriate priorities polarities and interconnections are adjusted as necessary.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, the current regulator functionality of the control module 312 may be embodied in a separate module. The comparator 330 may be included in the control module 312.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Furthermore, the entire functionality of the components shown in FIG. 3 or 5 may be implemented in an integrated circuit. Such an integrated circuit may be a package containing one or more dies. Alternatively, the examples may be implemented as any number of separate integrated circuits or separate devices interconnected with each other in a suitable manner.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

The invention claimed is:
1. An inductive load control circuit comprising:
a first driver stage comprising a first switch, controlled by a pulse width modulation (PWM) signal, for driving an inductive load and for providing an actuation path for inductive load current when the first switch is closed, wherein closing of the first switch defines an "on" phase and wherein opening of the first switch defines an "off" phase;
a second driver stage for providing a recirculation path for inductive load current when the first switch is opened;
a first current measuring stage; a second current measuring stage, wherein the first current measuring stage is arranged to sample a first peak value of the current flowing in the actuation path and the second current measuring stage is arranged to sample a second peak value of the current flowing in the recirculation path, and wherein the second current measuring stage is arranged to sample a mean value of the current in the recirculation path at a midpoint of the "off" phase; and
a comparator module for comparing the sampled first and second peak values of the current flowing in the actuation path and the recirculation path and for generating an error signal if a difference between the first and second peak values exceeds a predetermined threshold value, the error signal indicating a fault in the inductive load control circuit.

2. An inductive load control circuit comprising:
a first driver stage comprising a first switch, controlled by a pulse width modulation (PWM) signal, for driving an inductive load and for providing an actuation path for inductive load current when the first switch is closed, wherein closing of the first switch defines an "on" phase and wherein opening of the first switch defines an "off" phase;
a second driver stage for providing a recirculation path for inductive load current when the first switch is opened;
a first current measuring stage; a second current measuring stage, wherein the first current measuring stage is arranged to sample a first peak value of the current flowing in the actuation path and the second current measuring stage is arranged to sample a second peak value of the current flowing in the recirculation path, and wherein the first current measuring stage is arranged to sample a mean current in the actuation path at a midpoint of the "on" phase; and
a comparator module for comparing the sampled first and second peak values of the current flowing in the actuation path and the recirculation path and for generating an error signal if a difference between the first and second peak values exceeds a predetermined threshold value, the error signal indicating a fault in the inductive load control circuit.

3. The inductive load control circuit of claim 1 wherein the first current measuring stage is arranged to sample a high peak value of the current flowing in the actuation path at the end of the "on" phase, and the second current measuring stage is arranged to sample a high peak value of the current flowing in the recirculation path at the start of the "off" phase.

4. The inductive load control circuit of claim 2 wherein the second current measuring stage is arranged to sample a low peak value of the current flowing in the recirculation path at the end of the "off" phase, and the first current measuring stage is arranged to sample a low peak value of the current flowing in the actuation path at the start of the "on" phase.

5. The inductive load control circuit of claim 1 comprising a control module arranged to detect a second difference between the sampled mean value of the current and a target current value and to adjust a duty cycle of the PWM signal in order to minimize the second difference.

6. The inductive load control circuit of claim 1 comprising a control module for controlling sampling times of the first and second current measuring stages.

7. An inductive load control circuit comprising:
- a first driver stage comprising a first switch controlled by a pulse width modulation (PWM) signal, for driving an inductive load and for providing an actuation path for an inductive load current when the first switch is closed;
- a second driver stage comprising a second switch for providing a recirculation path for the inductive load current when the first switch is opened;
- a first current measuring stage;
- a second current measuring stage, wherein the first current measuring stage is arranged to sample a peak value of the current flowing in the actuation path and the second current measuring stage is arranged to sample a peak value of the current flowing in the recirculation path;
- a test current source for providing a test current; and
- control circuitry arranged to open the first switch and close the second switch when the current flowing in the actuation path reaches a predetermined value with respect to the test current, and wherein closing of the first switch defines an "on" phase and wherein opening of the first switch and closing of the second switch defines an "off" phase, and wherein the first current measuring stage is arranged to sample a high peak value of the current flowing in the actuation path at the end of the "on" phase, and the second current measuring stage is arranged to sample a high peak value of the current flowing in the recirculation path at the start of the "off" phase.

8. The inductive load control circuit of claim 1 implemented within an integrated circuit device comprising at least one die within a single integrated circuit package.

9. The inductive load control circuit of claim 1 wherein the inductive load comprises a coil of an electromagnetic valve.

10. A braking system for a vehicle, the braking system including the circuit of claim 9.

11. A method for measuring current in an inductive load control circuit comprising a first driver stage comprising a first switch, controlled by a pulse width modulation (PWM) signal, for actuation of an inductive load and for providing an actuation path for an inductive load current when the first switch is closed, and a second driver stage for providing a recirculation path for the inductive load current when the first switch is opened, wherein the method comprises: measuring a first peak value of the current flowing in the actuation path; measuring a second peak value of the current flowing in the recirculation path; determining a difference between the first and second peak values; comparing the difference between the first and second peak values with a predetermined threshold value; and generating an error signal if the difference is greater than the predetermined threshold value, the error signal indicating a fault in the inductive load control circuit, and wherein closing of the first switch defines an "on" phase and opening of the first switch defines an "off" phase, and the method further comprises: sampling a mean value of the current flowing in the recirculation path at a midpoint of the "off" phase; detecting a difference between the sampled mean value of the current flowing in the recirculation path and a target current value; and adjusting a duty cycle of the PWM signal in order to minimize the difference.

12. A method for measuring current in an inductive load control circuit comprising a first driver stage comprising a first switch, controlled by a pulse width modulation (PWM) signal, for actuation of an inductive load and for providing an actuation path for an inductive load current when the first switch is closed, and a second driver stage for providing a recirculation path for the inductive load current when the first switch is opened, wherein the method comprises: measuring a first peak value of the current flowing in the actuation path; measuring a second peak value of the current flowing in the recirculation path; determining a difference between the first and second peak values; comparing the difference between the first and second peak values with a predetermined threshold value; and generating an error signal if the difference is greater than the predetermined threshold value, the error signal indicating a fault in the inductive load control circuit, and wherein closing of the first switch defines an "on" phase and opening of the first switch defines an "off" phase, and the method further comprises: sampling a mean value of the current flowing in the actuation path at a midpoint of the "on" phase; detecting a difference between the sampled mean value of the current flowing in the actuation path and a target current value; and adjusting a duty cycle of the PWM signal in order to minimize the difference.

13. The inductive load control circuit of claim 2 comprising a control module arranged to detect a second difference between the sampled mean value of the current and a target current value and to adjust a duty cycle of the PWM signal in order to minimize the second difference.

* * * * *